(12) United States Patent
Wang et al.

(10) Patent No.: US 7,119,369 B2
(45) Date of Patent: Oct. 10, 2006

(54) FET HAVING EPITAXIAL SILICON GROWTH

(75) Inventors: Zhongze Wang, Boise, ID (US); Chih-Chen Cho, Boise, ID (US); Er-Xuan Ping, Meridian, ID (US)

(73) Assignee: Micro Technology, Inc., Boise, ID (US)

( * ) Notice: Subject to any disclaimer, the term of this patent is extended or adjusted under 35 U.S.C. 154(b) by 282 days.

(21) Appl. No.: 10/758,059

(22) Filed: Jan. 15, 2004

(65) Prior Publication Data

US 2004/0229414 A1    Nov. 18, 2004

Related U.S. Application Data

(62) Division of application No. 10/073,723, filed on Feb. 11, 2002, now Pat. No. 6,716,687.

(51) Int. Cl.
*H01L 27/108* (2006.01)

(52) U.S. Cl. ............ 257/69; 257/57; 257/63; 257/66; 257/192; 257/213; 257/288; 257/E21.619; 257/E21.634

(58) Field of Classification Search .......... 257/57, 257/63, 66, 69, 192, 288, 213, E21.619, E21.634
See application file for complete search history.

(56) References Cited

U.S. PATENT DOCUMENTS

| | | | |
|---|---|---|---|
| 5,481,126 A * | 1/1996 | Subramanian et al. ...... 257/273 |
| 5,908,313 A | 6/1999 | Chau et al. |
| 6,156,589 A | 12/2000 | Noble |
| 6,180,494 B1 | 1/2001 | Manning |
| 6,274,894 B1 * | 8/2001 | Wieczorek et al. ......... 257/192 |
| 6,274,913 B1 | 8/2001 | Brigham et al. |
| 6,300,219 B1 | 10/2001 | Doan et al. |
| 6,342,421 B1 * | 1/2002 | Mitani et al. ............... 438/300 |
| 6,358,798 B1 | 3/2002 | Chen |
| 6,388,294 B1 | 5/2002 | Radens et al. |
| 6,391,726 B1 | 5/2002 | Manning |
| 6,541,343 B1 * | 4/2003 | Murthy et al. .............. 438/299 |

OTHER PUBLICATIONS

Jacob Millman, Microelectronics: Digital and Analog Circuits and Systems, McGraw-Hill, 1979, pp. 289, 295.*
S. Wolf et al, "Silicon Epitaxial Film Growth," *Silicon Processing for the VLSI Era*, vol. 1, 1986, pp. 124-160.
U.S. Appl. No. 09/713,844, filed Nov. 15, 2000, Abbott et al.

* cited by examiner

*Primary Examiner*—George R. Fourson
*Assistant Examiner*—Thanh V. Pham
(74) *Attorney, Agent, or Firm*—Leffert Jay & Polglaze, P.A.

(57) ABSTRACT

A field-effect transistor has a channel region in a bulk semiconductor substrate, a first source/drain region on a first side of the channel region, a second source/drain region on a second side of the channel region, and an extension of epitaxial monocrystalline material formed on the bulk semiconductor substrate so as to extend away from each side of the channel region.

57 Claims, 6 Drawing Sheets

FET HAVING EPITAXIAL SILICON GROWTH

RELATED APPLICATIONS

This application is a divisional of U.S. patent application Ser. No. 10/073,723 filed Feb. 11, 2002, titled, "FET HAVING EPITAXIAL SILICON GROWTH," and issued as U.S. Pat. No. 6,716,687 on Apr. 6, 2004, which application is commonly assigned and incorporated herein by reference. The present invention is related to U.S. patent application Ser. No. 09/713,844 to Abbott et al., titled "METHOD OF FORMING A FIELD EFFECT TRANSISTOR," filed Nov. 15, 2000, issued as U.S. Pat. No. 6,599,789 on Jul. 29, 2003, which is commonly assigned and incorporated herein by reference.

TECHNICAL FIELD OF THE INVENTION

The present invention relates generally to integrated circuit devices, and in particular to the use of epitaxial silicon growth in a field-effect transistor to reduce source/drain junction leakage.

BACKGROUND OF THE INVENTION

Semiconductor processors continue to strive to reduce the size of individual electrical components, thereby enabling smaller and denser integrated circuitry. One typical device is a field-effect transistor. Such typically includes opposing semiconductive source/drain regions of one conductivity type having a semiconductive channel region of opposite conductivity type therebetween. A gate construction is received over the channel region. Current can be caused to flow between the source/drain regions through the channel region by applying a suitable voltage to the gate.

The channel region is in some cases composed of background doped bulk semiconductive substrate or well material, which is also received immediately beneath the opposite type doped source/drain regions. This results in a parasitic capacitance developing between the bulk substrate/well and the source/drain regions. This can adversely affect speed and device operation, and becomes an increasingly adverse factor as device dimensions continue to decrease.

Field-effect transistors have been described having channel regions formed separately from the source/drain regions. Such separate formation can result in a grain boundary between the source/drain regions and the channel region, which can produce a junction leakage problem when the grain boundary crosses the source/drain junction.

For the reasons stated above, and for other reasons stated below that will become apparent to those skilled in the art upon reading and understanding the present specification, there is a need in the art for alternative methods for producing field-effect transistors, and their resulting devices.

SUMMARY

U.S. Pat. No. 6,599,789 cited above includes a method of forming a field-effect transistor (FET) including forming a channel region within a bulk semiconductive material of a semiconductor substrate. Source/drain regions are formed on opposing sides of the channel region. A dielectric region is formed within the bulk semiconductive material proximately beneath at least one of the source/drain regions. The various embodiments described herein can reduce the potential for junction leakage in a FET of the type described in U.S. Pat. No. 6,599,789 by moving a grain boundary of a material interface away from the channel region of the FET. The grain boundary is moved by utilizing an epitaxial silicon growth on exposed portions of the bulk semiconductive material of the semiconductor substrate.

For one embodiment the invention provides a field-effect transistor that has a channel region in a bulk semiconductor substrate, a first source/drain region on a first side of the channel region, a second source/drain region on a second side of the channel region, and an extension of epitaxial monocrystalline material formed on the bulk semiconductor substrate so as to extend away from each side of the channel region.

For another embodiment, the invention provides a field-effect transistor (FET). The FET includes a channel region in a bulk semiconductor substrate, a first source/drain region on a first side of the channel region, a second source/drain region on a second side of the channel region, an extension of epitaxial silicon formed on the bulk semiconductor substrate so as to extend away from each side of the channel region, a field isolation region laterally adjoining the first source/drain region and extending beneath at least a portion of the first source/drain region, and a field isolation region laterally adjoining the second source/drain region and extending beneath at least a portion of the second source/drain region.

For another embodiment, the invention provides a FET. The FET includes a channel region in a monocrystalline silicon substrate, a first source/drain region on a first side of the channel region, a second source/drain region on a second side of the channel region, epitaxial silicon formed on the monocrystalline silicon substrate so as to extend away from each side of the channel region, and a gate overlying the channel region. For a further embodiment, the source/drain regions are polycrystalline silicon.

Further embodiments of the invention include apparatus of varying scope.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Figure 1A:
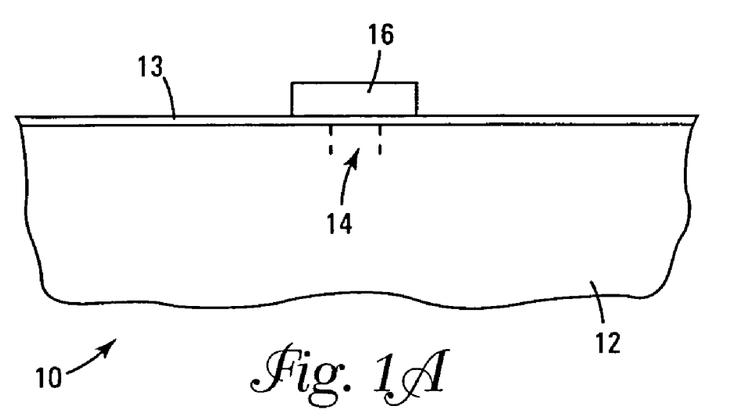
FIGS. 1A–1J are sectional views of the fabrication of a field-effect transistor in accordance with an embodiment of the invention.

FIGS. 1A–1J depict fabrication of a field-effect transistor (FET) in accordance with an embodiment of the invention. Referring initially to FIG. 1A, a semiconductor substrate is indicated generally with reference 10.

Substrate 10 comprises a bulk semiconductor substrate 12. For one embodiment, the bulk semiconductor substrate 12 is a monocrystalline material, such as monocrystalline silicon lightly doped with p-type material. In the context of this document, the term "bulk" also includes doped well regions within such substrates. Bulk semiconductor substrate 12 comprises a channel region 14 which is shown as being masked by a pad oxide layer 13 and a patterned block of masking material 16. For an exemplary 0.15 micron transistor gate width, an exemplary thickness for layer 13 is 100 Angstroms. An exemplary preferred material for mask 16 is silicon nitride deposited to an exemplary thickness of 900 Angstroms. An example width is 0.25 micron. In the illustrated embodiment, masking material 16 extends laterally beyond the lateral confines of channel region 14. Such provides but one example of forming a channel region within bulk semiconductive material of a semiconductor substrate, and of masking the same.

Figure 1B:
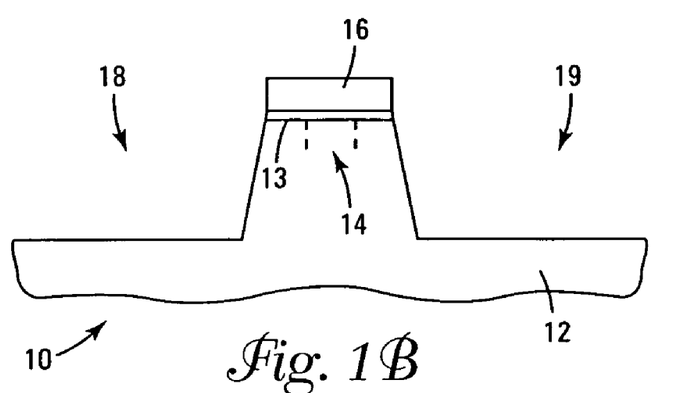

Referring to FIG. 1B, at least one trench is formed into the bulk semiconductor substrate on at least one side of the channel region received within the bulk semiconductor substrate. Preferably and as shown, two trenches 18, 19 are formed into bulk semiconductor substrate 12 on opposing sides of masked channel region 14. Such preferably occurs by any existing or yet-to-be developed substantially anisotropic etching technique. An exemplary preferred depth for the trench etching is 1700 Angstroms.

Figure 1C:
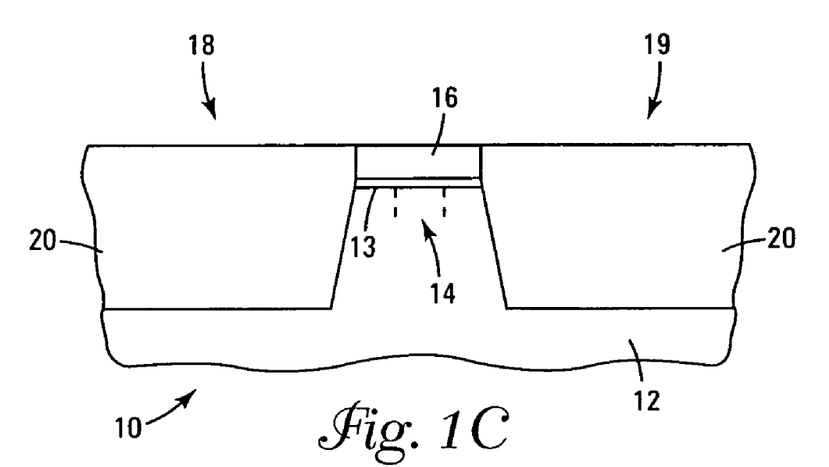

Referring to FIG. 1C, a dielectric, or insulative, material 20 is deposited over masking material 16 and within and overfilling trenches 18 and 19. Exemplary and preferred processing includes sidewall oxidation before deposition of layer 20. For one embodiment, the material for layer 20 is high-density plasma deposited oxide. The dielectric material is preferably initially deposited to overfill the trenches and then subsequently planarized at least to masking material 16 to provide the construction as illustrated in FIG. 1C. Example planarizing techniques include chemical-mechanical polishing (CMP) and resist etch-back.

Figure 1D:
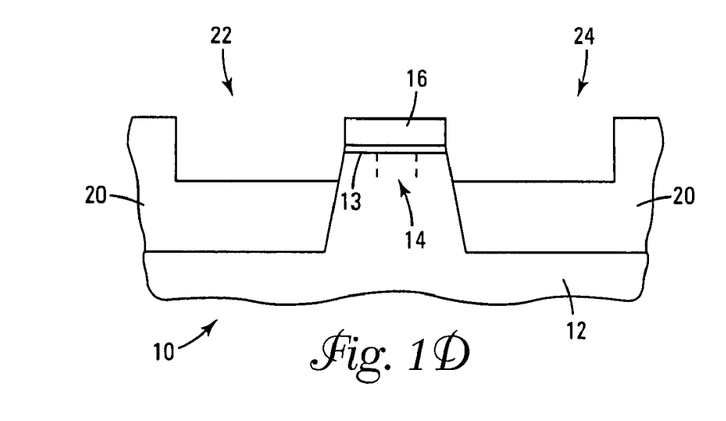

Referring to FIG. 1D, portions of dielectric material 20 are removed from within trenches 18 and 19 effective to form at least one and preferably two as shown, source/drain voids 22 and 24 on the respective sides of channel region 14. Such removal as shown is also preferably effective to expose bulk semiconductive material 12. An example preferred depth of voids 22 and 24 within dielectric material 20 is 1500–2000 Angstroms, or a depth sufficient to expose approximately 500–1000 Angstroms of the bulk semiconductive material 12. For one embodiment, the removal technique is a timed anisotropic etch, and with a photolithographic patterned mask being received over the non-etched portions of layer 20. In the illustrated embodiment, such effectively defines the outlines of the source/drains of the FETs being formed. Preferably and as shown, such removing forms an outer surface of dielectric material 20 to be planar at the base of such voids 22 and 24.

Figure 1E:
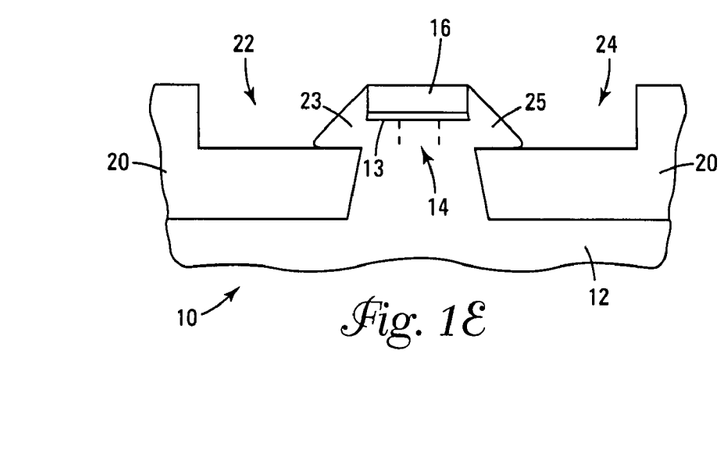

Referring to FIG. 1E, an epitaxial silicon growth, or deposition, is performed. Epitaxial silicon growth will be selective to portions of the monocrystalline silicon 12 exposed by voids 22 and 24. The epitaxial silicon will grow both horizontally and vertically from the exposed portions of the monocrystalline silicon 12. Such selective growth will produce the extensions of monocrystalline silicon 23 and 25 in voids 22 and 24, respectively. The extensions of monocrystalline silicon 23 and 25 will move the grain boundary away from the channel region 14, thus facilitating a reduction in potential source/drain junction leakage of the final FET.

Epitaxial deposition of silicon is a chemical vapor deposition (CVD) process used to produce a layer of single crystal material upon a surface of a single crystal substrate. Silicon precursors are transported to, and adsorbed on, the surface of the substrate 10. Common silicon precursors for the production of epitaxial silicon as the single crystal material include silicon tetrachloride ($SiCl_4$), trichlorosilane ($SiHCl_3$), dichlorosilane ($SiH_2Cl_2$) and silane ($SiH_4$). The chemical reaction to produce monocrystalline silicon proceeds preferentially on exposed monocrystalline silicon where nucleation is favored, with the newly formed silicon providing an advancing reaction interface and new nucleation sites.

The process of epitaxial silicon growth is well understood in the art. Typical deposition temperatures range from about 600° C. to about 1250° C. Depth of the epitaxial growth is typically controlled through reaction time, or time that the substrate 10 is exposed to the reactant gases and their reaction conditions. Typical reaction times may range from about 1 minute to about 15 minutes or more, depending upon the desired depth. For one embodiment, the extensions of monocrystalline silicon 23 and 25 have a maximum depth of approximately 300 Angstroms to 3000 Angstroms or more. For a further embodiment, the extensions of monocrystalline silicon 23 and 25 have a maximum depth of approximately 500 Angstroms to 1500 Angstroms. For a still further embodiment, the extensions of monocrystalline silicon 23 and 25 have a maximum depth of approximately 1000 Angstroms. For another embodiment, the epitaxial silicon growth may be carried out to fill the voids 22 and 24 with monocrystalline silicon.

Selective epitaxial deposition occurs when silicon atoms having high surface mobility are deposited from the silicon source or precursor. These silicon atoms migrate to sites on the single crystal material where nucleation is favored. Others have observed that silicon mobility is enhanced by the presence of halides in the reaction gases. Other factors recognized to enhance the selective nature of the silicon deposition include reduced reaction pressure, increased reaction temperature and decreased mole fraction of silicon in the reaction gases. Some polysilicon growth may occur concurrently with the epitaxial growth due to reactions occurring on non-monocrystalline surfaces, e.g., exposed surfaces of the dielectric material 20. However, epitaxial silicon growth on the exposed portions of the monocrystalline silicon 12 should be the dominant reaction.

For one embodiment, the epitaxial silicon growth is undoped monocrystalline silicon. For another embodiment, the epitaxial silicon growth is doped monocrystalline silicon. Doping of the epitaxial silicon growth can be used to alter the conductive properties of the resulting monocrystalline silicon, to reduce the temperature of formation or to otherwise alter the properties of the resulting material. The dopants, or impurities, are added to the reaction gases during the epitaxial silicon growth. Doping epitaxial growth is typically carried out by adding hydrides of the dopant materials to the reaction gases. For example, diborane ($B_2H_6$) may be added to the reaction gases to form a boron-doped monocrystalline silicon. For one embodiment, the epitaxial silicon growth is doped with germanium (Ge). For a further embodiment, the germanium doping is carried out using germanium tetrahydride ($GeH_4$). For a still further embodiment, the epitaxial silicon growth is a growth of a silicon-germanium ($Si_xGe_{1-x}$) alloy. Silicon-germanium alloy can be grown epitaxially on silicon. For one embodiment, the silicon-germanium alloy contains approximately 20 at % germanium or more, e.g., $0<=x<=0.8$. For a further embodiment, the silicon-germanium alloy further contains no more than approximately 50 at % germanium, e.g., $0.5<=x<=0.8$.

Figure 1F:
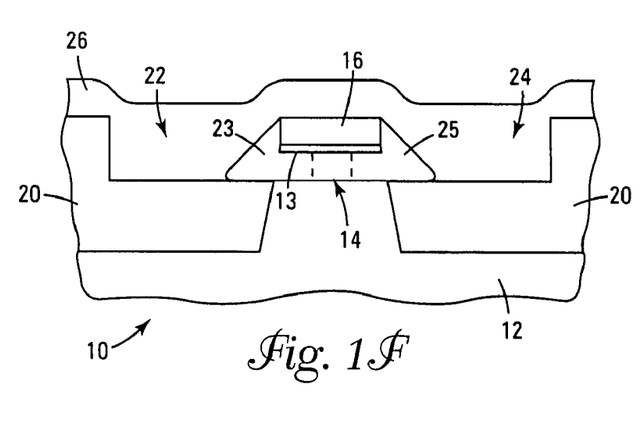

Referring to FIG. 1F, source/drain semiconductive material 26 is formed within voids 22 and 24. For one embodiment, the material 26 is polycrystalline material. For one embodiment, the material is polycrystalline silicon, preferably in situ conductively doped with a conductivity enhancing impurity during a chemical vapor deposition. The conductivity type for the source/drain material 26 is chosen to be a type opposite that of the bulk semiconductor substrate 12. For a p-type bulk semiconductor substrate 12, an n-type impurity would be used for the source/drain material 26. The source/drain material 26 preferably covers and physically contacts the extensions of monocrystalline silicon 23 and 25.

Figure 1G:
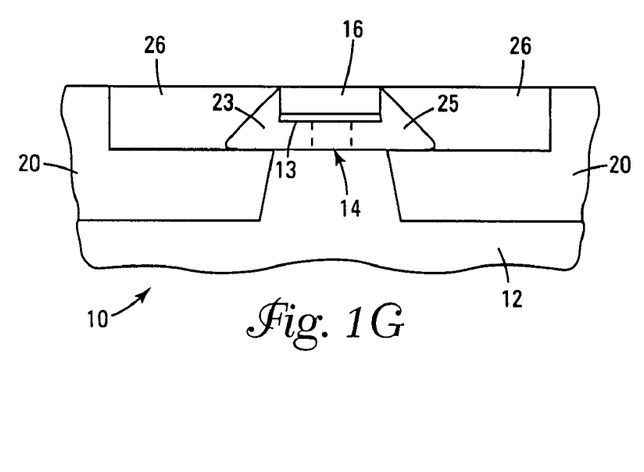

Referring to FIG. 1G, deposited semiconductive material 26 is planarized at least to a level of masking material 16. Example and preferred techniques include CMP and resist etch back.

Figure 1H:
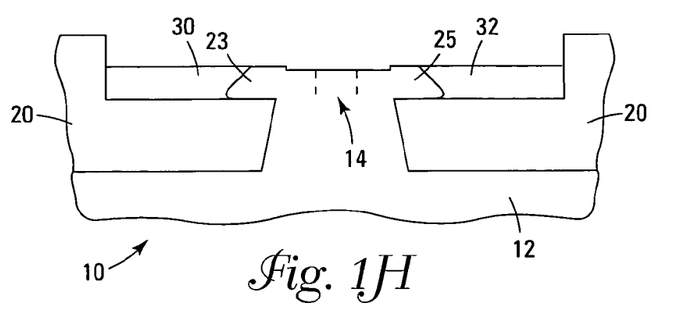

Referring to FIG. 1H, channel region 14 is unmasked preferably by etching away all of the masking material 16 and all of pad oxide layer 13. Further preferably as shown, some and only some of semiconductive material 26 is etched from the substrate. Such might occur in one or more etching steps depending on the chemistry utilized and the desires of the processor, as readily determinable by the artisan. By way of example only, an example etch chemistry that will etch polysilicon and silicon nitride in a substantially nonselective manner includes plasma $CF_4$, $CH_2F_2$ and He. In the subject example, the preferred amount of semiconductive material left is 900 Angstroms thick. Such provides but one example of forming source/drain regions 30 and 32 on opposing sides of channel region 14. The upper surface of channel region 14 in FIG. 1H is preferably approximately 200 Angstroms beneath the upper surfaces of regions 30 and 32, which are also preferably substantially planar. The resulting step between the upper surface of the dielectric material 20 and the upper surfaces of regions 30 and 32 is preferably reduced, if necessary, to between approximately 200–300 Angstroms. Such can be accomplished, for example, with a simple HF clean.

Figure 1I:
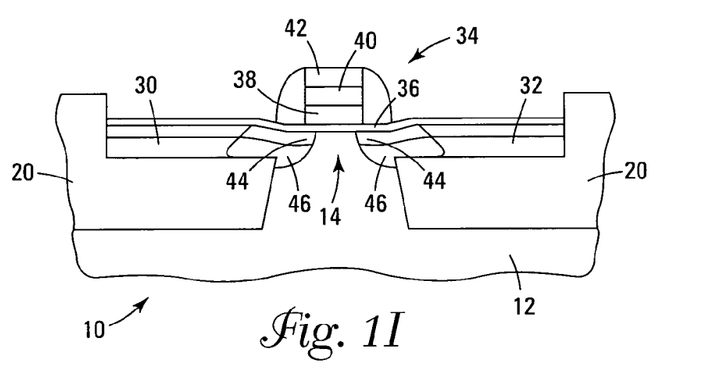

Referring to FIG. 1I, a gate 34 is formed over channel region 14. Preferably as shown, a gate dielectric layer 36, for example silicon dioxide, is first formed over channel region 14. A gate stack is then formed over channel region 14. For one embodiment, the gate stack includes a conductively doped polysilicon layer 38 and a conductive silicide layer 40 (for example $WSi_x$) and a nitride capping layer 42. Thereafter, at least one pocket implanting is conducted to provide at least one pocket implant region intermediate source/drain semiconductive material 26, forming region 30/32, and channel region 14. In the illustrated and preferred example, exemplary pocket implants include source/drain extension (SDE) implant regions 44 having a thickness of approximately 500 Angstroms, and halo implant regions 46 provided therebeneath having an approximate thickness of 500 Angstroms and to extend below source/drain regions 30 and 32. Insulative spacers are subsequently added as shown. Rapid thermal processing is preferably conducted at some point, as is conventional.

Figure 1J:
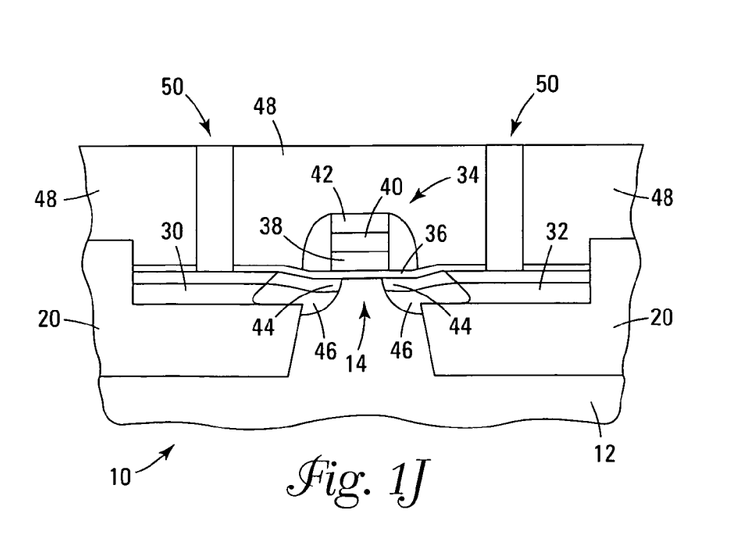
Figure 2:
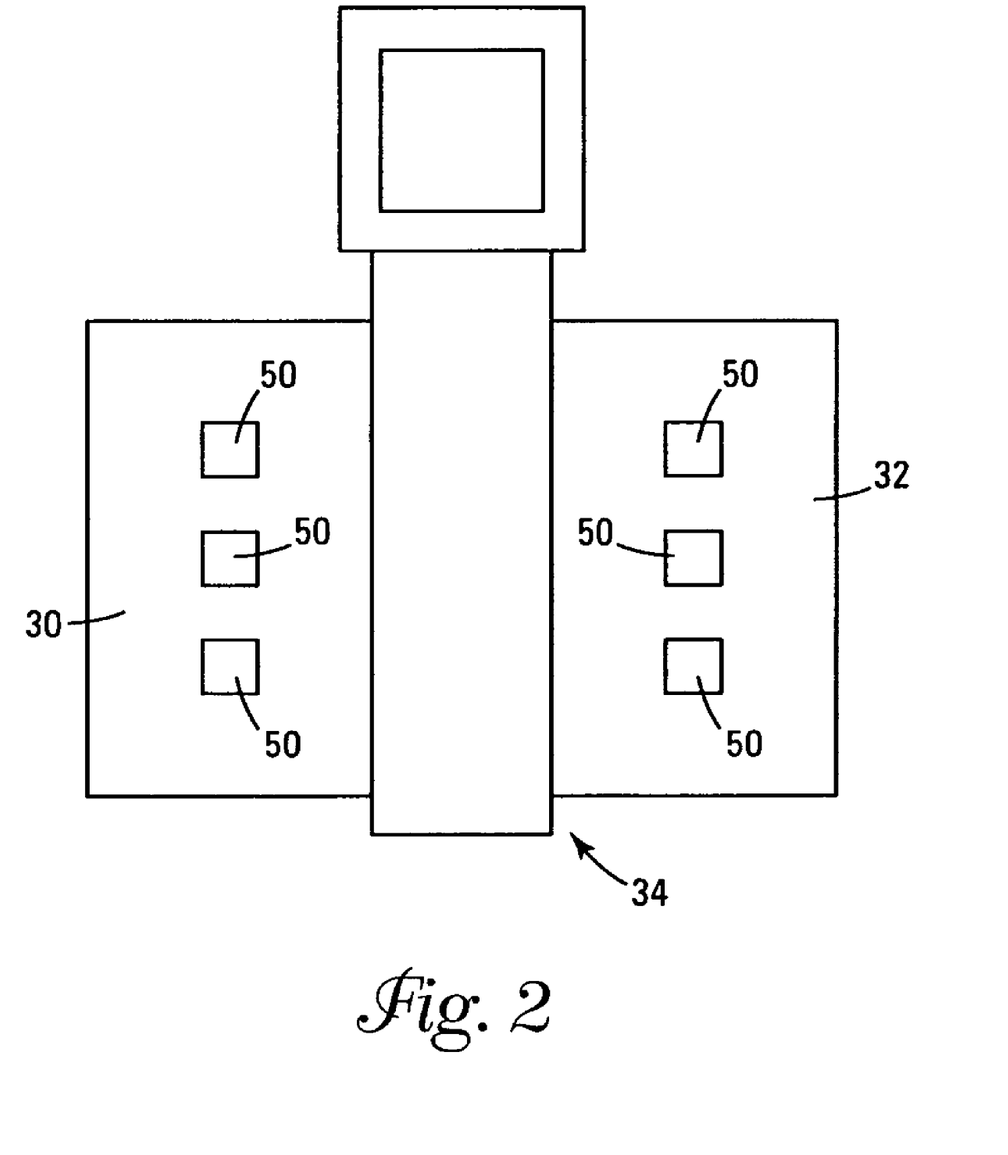
FIG. 2 is a planar view of a FET produced in accordance with a fabrication process described with reference to FIGS. 1A–1J.

Referring to FIG. 1J, subsequent exemplary processing is illustrated. Depicted is the provision and planarizing of a dielectric layer 48, for example borophosphosilicate glass (BPSG). Contact openings have been formed therethrough and plugged with conductive material to form source/drain contacts 50. FIG. 2 is a planar view of a FET produced in accordance with a fabrication process described with reference to FIGS. 1A–1J. Field-effect transistors of the type described herein may be used in a variety of integrated circuit devices. Some examples include memory devices, microprocessors, digital signal processors (DSP) and more.

Figure 3:
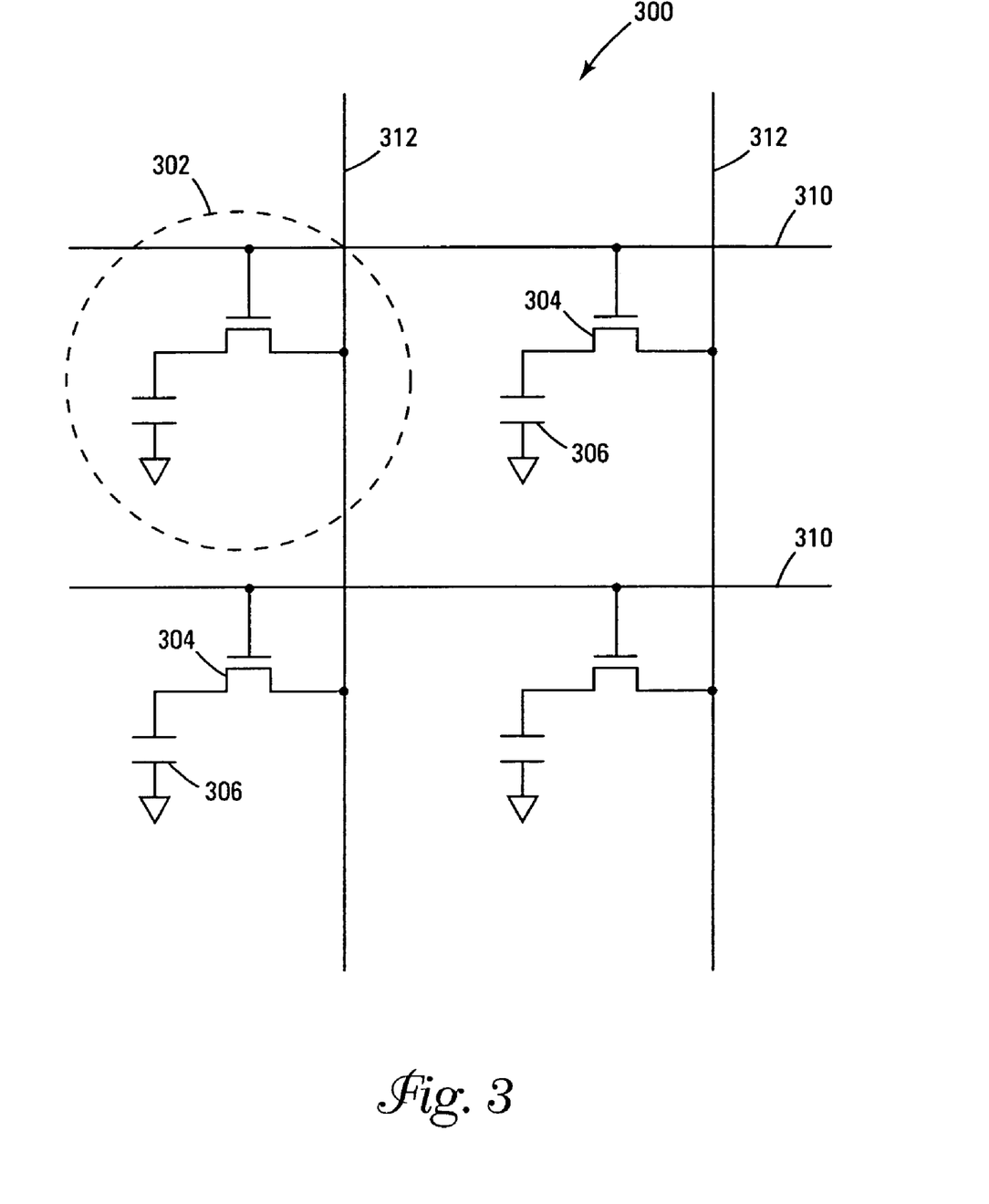
FIG. 3 is a schematic of a portion of a memory array in accordance with an embodiment of the invention.

FIG. 3 is a schematic of a portion of a memory array 300 containing field-effect transistors as described herein. The memory array 300 includes a number of memory cells 302 arranged generally in rows and columns. Typical memory arrays 300 contain millions of these memory cells 302. Each memory cell 302 includes an access transistor 304, with the gate of each access transistor 304 coupled to a word line 310. The access transistor 304 is a field-effect transistor in accordance with an embodiment of the invention.

A first source/drain region of an access transistor 304 is coupled to a bit line 312 and a second source/drain region of the access transistor 304 is coupled to a capacitor 306. The data value of the memory cell 304 is stored as a charge on the capacitor 306 and the data value is sensed by charge sharing with the associated bit line 312 and detecting the change to the bit-line potential as a result of the charge sharing. A grouping of memory cells 302 coupled to the same word line 310 are typically referred to as a row of memory cells. Likewise, a grouping of memory cells 302 coupled to the same bit line 312 are typically referred to as a column of memory cells.

Figure 4:
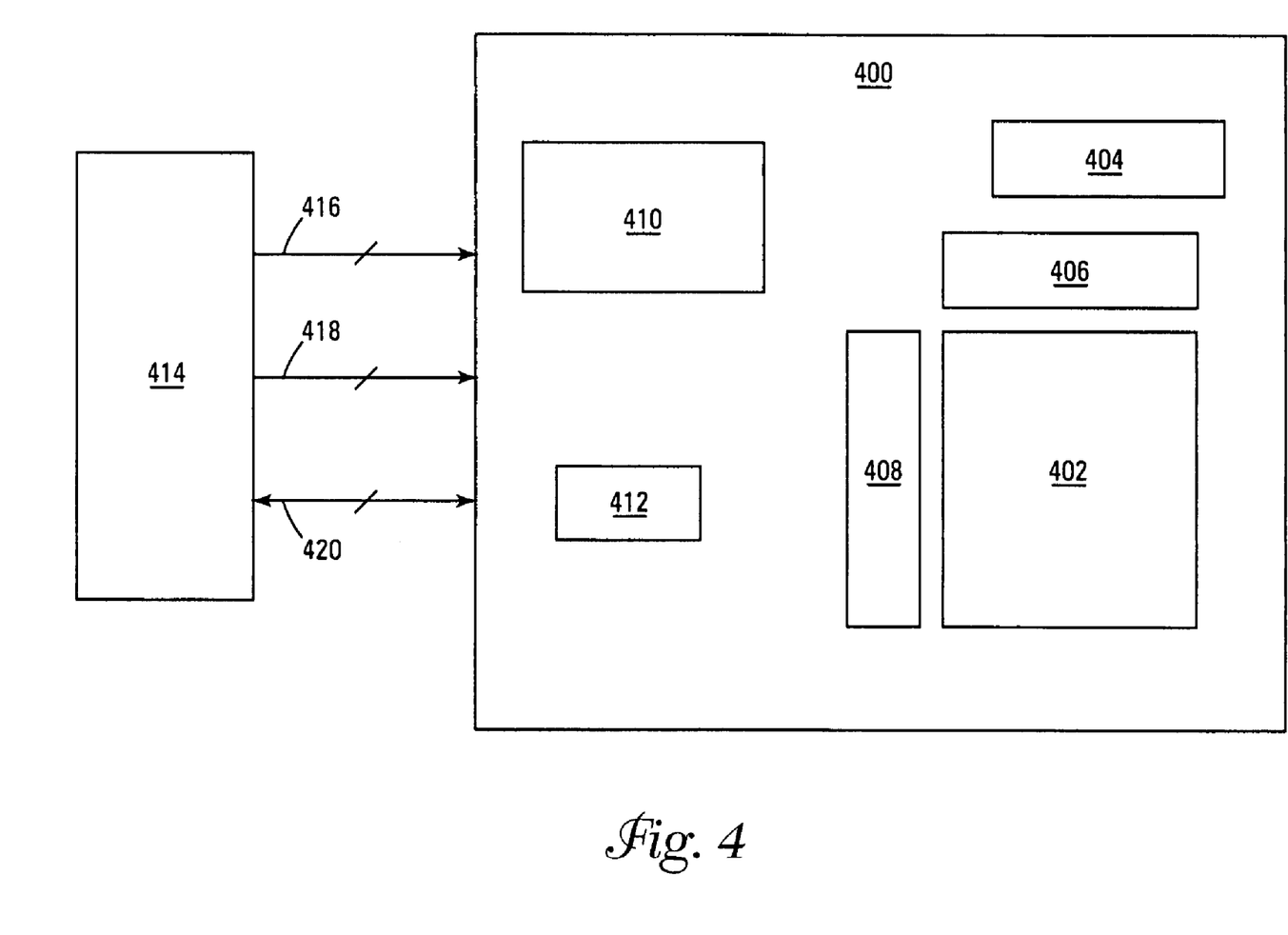
FIG. 4 is a simplified block diagram of an integrated circuit memory device in accordance with an embodiment of the invention.

FIG. 4 is a simplified block diagram of an integrated circuit memory device 400 as a dynamic random access memory (DRAM) device in accordance with an embodiment of the invention. The memory device 400 includes an array of memory cells 402, an address decoder 404, row access circuitry 406, column access circuitry 408, control circuitry 410, and Input/Output (I/O) circuitry 412. The memory array 402 contains memory cells having an access transistor coupled between a bit line and a capacitor.

The memory device 400 can be coupled to a processor 414 or other memory controller for accessing the memory array 402. The memory device 400 coupled to a processor 414 forms part of an electronic system. Some examples of electronic systems include personal computers, peripheral devices, wireless devices, digital cameras, personal digital assistants (PDAs) and audio recorders.

The memory device 400 receives control signals across control lines 416 from the processor 414 to control access to the memory array 402. Access to the memory array 402 is directed to one or more target memory cells in response to address signals received across address lines 418. Once accessed in response to the control signals and the address signals, data is written to or read from the memory cells across DQ lines 420.

The memory cells of the memory array 402 are generally arranged in rows and columns with a memory cell located at each intersection of a bit line and a word line. Those memory cells coupled to a single word line are generally referred to as a row of memory cells while those memory cells coupled to a single bit line are generally referred to as a column of memory cells.

It will be understood that the above description of a DRAM is intended to provide a general understanding of the memory and is not a complete description of all the elements and features of a DRAM. Further, the invention is equally applicable to a variety of sizes and types of memory circuits known in the art and is not intended to be limited to the DRAM described above.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

The foregoing figures were used to aid the understanding of the accompanying text. However, the figures are not drawn to scale and relative sizing of individual features and layers are not necessarily indicative of the relative dimensions of such individual features or layers in application. Accordingly, the drawings are not to be used for dimensional characterization.

Although dimensional characteristics were provided herein for information purposes, it is recognized that there is a continuing drive to reduce integrated circuit device dimensions for increased performance and reduced fabrication costs. In addition, the concepts described herein are not fundamentally limited by absolute dimensions. Accordingly, improvements in fabrication and sensing technologies are expected to facilitate reduced dimensional characteristics of the FET devices described herein, particularly as they relate to layer thickness and width.

CONCLUSION

Field-effect transistors, and methods of their fabrication, have been described having channel regions formed separately from their source/drain regions and having monocrystalline silicon interposed between the channel regions and the source/drain regions. The monocrystalline silicon interposed between the channel regions and the source/drain regions may be formed through an epitaxial silicon growth as extensions from the channel region. These extensions of epitaxial silicon serve to move the grain boundary of the source/drain regions away from the channel regions. Moving the grain boundary can reduce the likelihood of source/drain junction leakage.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A field-effect transistor, comprising:
a channel region in a bulk semiconductor substrate;
a first source/drain region on a first side of the channel region;
a second source/drain region on a second side of the channel region;
an extension of epitaxial silicon formed on the bulk semiconductor substrate so as to extend away from each side of the channel region;
a field isolation region laterally adjoining the first source/drain region and extending beneath only a portion of the first source/drain region; and
a field isolation region laterally adjoining the second source/drain region and extending beneath only a portion of the second source/drain region;
wherein the first and second source/drain regions each comprise polysilicon interposed between the extension of epitaxial silicon and the corresponding field isolation region.

2. A field-effect transistor, comprising:
a channel region in a bulk semiconductor substrate;
a first source/drain region on a first side of the channel region;
a second source/drain region on a second side of the channel region;
an extension of epitaxial silicon formed on the bulk semiconductor substrate so as to extend away from each side of the channel region;
a field isolation region laterally adjoining the first source/drain region and extending beneath at least a portion of the first source/drain region; and
a field isolation region laterally adjoining the second source/drain region and extending beneath at least a portion of the second source/drain region;
wherein the bulk semiconductor substrate comprises monocrystalline silicon having a first conductivity type, the source/drain regions comprise polysilicon having a second conductivity type opposite the first conductivity type, and the extensions of epitaxial silicon comprise epitaxial silicon having a conductivity type.

3. The field-effect transistor of claim 2, wherein the conductivity type of the epitaxial silicon is the second conductivity type.

4. The field-effect transistor of claim 3, wherein the epitaxial silicon is further doped with germanium.

5. A field-effect transistor, comprising:
a channel region in a bulk semiconductor substrate;
a first source/drain region on a first side of the channel region and having a polycrystalline portion;
a second source/drain region on a second side of the channel region and having a polycrystalline portion;
first and second extensions of epitaxial silicon formed on the bulk semiconductor substrate, the first and second extensions of epitaxial silicon respectively extending away from the first and second sides of the first channel region, the first extension of epitaxial silicon interposed between the first side of the channel region and the polysilicon portion of the first source/drain region and the second extension of epitaxial silicon interposed between the second side of the channel region and the polysilicon portion of the second source/drain region;
a field isolation region laterally adjoining the first source/drain region and extending beneath at least a portion of the first source/drain region and extending beneath at least a portion of the first extension of epitaxial silicon; and a field isolation region laterally adjoining the second source/drain region and extending beneath at least a portion of the second source/drain region and extending beneath at least a portion of the second extension of epitaxial silicon.

6. A field-effect transistor, comprising:
a channel region in a monocrystalline silicon substrate;
a first source/drain region on a first side of the channel region;
a second source/drain region on a second side of the channel region;
epitaxial silicon formed on the monocrystalline silicon substrate so as to extend away from each side of the channel region; and
a gate overlying the channel region;
wherein the monocrystalline silicon substrate comprises monocrystalline silicon having a first conductivity type, the source/drain regions comprise polysilicon having a second conductivity type opposite the first conductivity type, and the epitaxial silicon has a conductivity type.

7. A field-effect transistor, comprising:
a channel region in a monocrystalline silicon substrate;
a first source/drain region on a first side of the channel region and having a polycrystalline portion;
a second source/drain region on a second side of the channel region and having a polycrystalline portion;
epitaxial silicon interposed between the channel region and the polycrystalline portion of each source/drain region; and
a gate overlying the channel region.

8. A memory device, comprising:
a plurality of word lines;
a plurality of bit lines;
a plurality of memory cells, wherein each memory cell comprises:
  a capacitor; and
  an access transistor having a gate coupled to a word line, a first source/drain region coupled to a bit line and a second source/drain region coupled to the capacitor;
  wherein the access transistor further comprises:
    a channel region in a bulk semiconductor substrate with the first source/drain region on a first side of the channel region and the second source/drain region on a second side of the channel region;
    an extension of epitaxial silicon formed on the bulk semiconductor substrate so as to extend away from each side of the channel region;
    a field isolation region laterally adjoining the first source/drain region and extending beneath at least a portion of the first source/drain region; and
    a field isolation region laterally adjoining the second source/drain region and extending beneath at least a portion of the second source/drain region;
    wherein the first and second source/drain regions each comprise polysilicon interposed between the extension of epitaxial silicon and the corresponding field isolation region.

9. A memory device, comprising:
a plurality of word lines;
a plurality of bit lines;
a plurality of memory cells, wherein each memory cell comprises:
  a capacitor; and
  an access transistor having a gate coupled to a word line, a first source/drain region coupled to a bit line and a second source/drain region coupled to the capacitor;
  wherein the access transistor further comprises:
    a channel region in a bulk semiconductor substrate with the first source/drain region on a first side of the channel region and the second source/drain region on a second side of the channel region;
    an extension of epitaxial silicon formed on the bulk semiconductor substrate so as to extend away from each side of the channel region;
    a field isolation region laterally adjoining the first source/drain region and extending beneath at least a portion of the first source/drain region; and
    a field isolation region laterally adjoining the second source/drain region and extending beneath at least a portion of the second source/drain region;
    wherein the bulk semiconductor substrate comprises monocrystalline silicon having a first conductivity type, the source/drain regions comprise polysilicon having a second conductivity type opposite the first conductivity type, and the extensions of epitaxial silicon comprise epitaxial silicon having a conductivity type.

10. The memory device of claim 9, wherein the conductivity type of the epitaxial silicon is the second conductivity type.

11. The memory device of claim 10, wherein the epitaxial silicon is further doped with germanium.

12. A memory device, comprising:
a plurality of word lines;
a plurality of bit lines;
a plurality of memory cells, wherein each memory cell comprises:
  a capacitor; and
  an access transistor having a gate coupled to a word line, a first source/drain region coupled to a bit line and a second source/drain region coupled to the capacitor;
  wherein the access transistor further comprises:
    a channel region in a bulk semiconductor substrate with the first source/drain region on a first side of the channel region and the second source/drain region on a second side of the channel region;
    first and second extensions of epitaxial silicon formed on the bulk semiconductor substrate, the first and second extensions of epitaxial silicon respectively extending away from the first and second sides of the channel region;
    a field isolation region laterally adjoining the first source/drain region and extending beneath at least a portion of the first source/drain region and extending beneath at least a portion of the first extension of epitaxial silicon; and
    a field isolation region laterally adjoining the second source/drain region and extending beneath at least a portion of the second source/drain region and extending beneath at least a portion of the second extension of epitaxial silicon.
    wherein the first and second source/drain regions each comprise polysilicon interposed between the extension of epitaxial silicon and the corresponding field isolation region.

13. A memory device, comprising:
a plurality of word lines;
a plurality of bit lines;

a plurality of memory cells, wherein each memory cell comprises:
a capacitor; and
an access transistor having a gate coupled to a word line, a first source/drain region coupled to a bit line and a second source/drain region coupled to the capacitor the first and second source/drain regions each having a polysilicon portion;
wherein the access transistor further comprises:
a channel region in a monocrystalline silicon substrate with the first source/drain region on a first side of the channel region and the second source/drain region on a second side of the channel region; and
epitaxial silicon formed on the monocrystalline silicon substrate so as to extend away from each side of the channel region wherein the epitaxial silicon is interposed between the first side of the channel region and the polysilicon portion of the first source/drain region and between the second side of the channel region and the polysilicon portion of the second source/drain region.

14. A memory device, comprising:
a plurality of word lines;
a plurality of bit lines;
a plurality of memory cells, wherein each memory cell comprises:
a capacitor; and
an access transistor having a gate coupled to a word line, a first source/drain region coupled to a bit line and a second polycrystalline source/drain region coupled to the capacitor, each of the first and second source/drain regions having a polycrystalline silicon portion;
wherein the access transistor further comprises:
a channel region in a monocrystalline silicon substrate with the first source/drain region on a first side of the channel region and the second source/drain region on a second side of the channel region; and
epitaxial silicon interposed between the channel region and the polycrystalline silicon portion of each source/drain region.

15. The memory device of claim 14, further comprising a gate overlying the channel region.

16. A field-effect transistor, comprising:
a channel region in a bulk semiconductor substrate;
a first source/drain region on a first side of the channel region;
a second source/drain region on a second side of the channel region;
an extension of silicon-germanium alloy formed on the bulk semiconductor substrate so as to extend away from each side of the channel region;
a field isolation region laterally adjoining the first source/drain region and extending beneath at least a portion of the first source/drain region; and
a field isolation region laterally adjoining the second source/drain region and extending beneath at least a portion of the second source/drain region.
wherein the first and second source/drain regions each comprise polysilicon interposed between the extension of epitaxilal silicon and the corresponding field isolation region.

17. A field-effect transistor, comprising:
a channel region in a bulk semiconductor substrate;
a first source/drain region on a first side of the channel region;
a second source/drain region on a second side of the channel region;
an extension of silicon-germanium alloy formed on the bulk semiconductor substrate so as to extend away from each side of the channel region;
a field isolation region laterally adjoining the first source/drain region and extending beneath at least a portion of the first source/drain region; and
a field isolation region laterally adjoining the second source/drain region and extending beneath at least a portion of the second source/drain region;
wherein the bulk semiconductor substrate comprises monocrystalline silicon having a first conductivity type, the source/drain regions comprise polysilicon having a second conductivity type opposite the first conductivity type, and the extensions of silicon-germanium alloy comprise silicon-germanium alloy having a conductivity type.

18. The field-effect transistor of claim 17, wherein the conductivity type of the silicon-germanium alloy is the second conductivity type.

19. The field-effect transistor of claim 16, wherein the silicon-germanium alloy comprises an epitaxially-grown silicon-germanium alloy.

20. The field-effect transistor of claim 16, wherein the silicon-germanium alloy comprises approximately 20 at % germanium or more.

21. The field-effect transistor of claim 20, wherein the silicon-germanium alloy further comprises no more than approximately 50 at % germanium.

22. A field-effect transistor, comprising:
a channel region in a bulk semiconductor substrate;
a first source/drain region on a first side of the channel region;
a second source/drain region on a second side of the channel region;
first and second extensions of silicon-germanium alloy formed on the bulk semiconductor substrate, the first and second extensions of silicon-germanium alloy respectively extending away from the first and second sides of the channel region;
a field isolation region laterally adjoining the first source/drain region and extending beneath at least a portion of the first source/drain region and extending beneath only a portion of the first extension of silicon-germanium alloy; and
a field isolation region laterally adjoining the second source/drain region and extending beneath at least a portion of the second source/drain region and extending beneath only a portion of the second extension of silicon-germanium alloy;
wherein the first and second source/drain regions each comprise polysilicon interposed between the extension of epitaxial silicon and the corresponding field isolation region.

23. A field-effect transistor, comprising:
a channel region in a monocrystalline silicon substrate;
a first source/drain region on a first side of the channel region;
a second source/drain region on a second side of the channel region;
epitaxial silicon-germanium alloy formed on the monocrystalline silicon substrate so as to extend away from each side of the channel region; and
a gate overlying the channel region;

wherein the monocrystalline silicon substrate comprises monocrystalline silicon having a first conductivity type, the source/drain regions comprise polysilicon having a second conductivity type opposite the first conductivity type, and the epitaxial silicon-germanium alloy has a conductivity type.

24. The field-effect transistor of claim 23, wherein the epitaxial silicon-germanium alloy comprises approximately 20 at % germanium or more.

25. The field-effect transistor of claim 24, wherein the epitaxial silicon-germanium alloy further comprises no more than approximately 50 at % germanium.

26. A field-effect transistor, comprising:
a channel region in a monocrystalline silicon substrate;
a first source/drain region on a first side of the channel region and having a polycrystalline portion;
a second polycrystalline silicon source/drain region on a second side of the channel region and having a polycrystalline portion;
epitaxial silicon-germanium alloy interposed between the channel region and the polycrystalline portion of each source/drain region; and
a gate overlying the channel region.

27. The field-effect transistor of claim 26, wherein the epitaxial silicon-germanium alloy comprises between approximately 20–50 at % germanium.

28. A memory device, comprising:
a plurality of word lines;
a plurality of bit lines;
a plurality of memory cells, wherein each memory cell comprises:
a capacitor; and
an access transistor having a gate coupled to a word line, a first source/drain region coupled to a bit line and a second source/drain region coupled to the capacitor;
wherein the access transistor further comprises:
a channel region in a bulk semiconductor substrate with the first source/drain region on a first side of the channel region and the second source/drain region on a second side of the channel region;
an extension of epitaxial silicon-germanium alloy formed on the bulk semiconductor substrate so as to extend away from each side of the channel region;
a field isolation region laterally adjoining the first source/drain region and extending beneath only a portion of the first source/drain region; and
a field isolation region laterally adjoining the second source/drain region and extending beneath only a portion of the second source/drain region;
wherein the first and second source/drain regions each comprise polysilicon interposed between the extension of epitaxial silicon and the corresponding field isolation region.

29. A memory device, comprising:
a plurality of word lines;
a plurality of bit lines;
a plurality of memory cells, wherein each memory cell comprises:
a capacitor; and
an access transistor having a gate coupled to a word line, a first source/drain region coupled to a bit line and a second source/drain region coupled to the capacitor;
wherein the access transistor further comprises:
a channel region in a bulk semiconductor substrate with the first source/drain region on a first side of the channel region and the second source/drain region on a second side of the channel region;
an extension of epitaxial silicon-germanium alloy formed on the bulk semiconductor substrate so as to extend away from each side of the channel region;
a field isolation region laterally adjoining the first source/drain region and extending beneath at least a portion of the first source/drain region; and
a field isolation region laterally adjoining the second source/drain region and extending beneath at least a portion of the second source/drain region;
wherein the bulk semiconductor substrate comprises monocrystalline silicon having a first conductivity type, the source/drain regions comprise polysilicon having a second conductivity type opposite the first conductivity type, and the extensions of silicon-germanium alloy comprise silicon-germanium alloy having a conductivity type.

30. The memory device of claim 29, wherein the conductivity type of the silicon-germanium alloy is the second conductivity type.

31. The memory device of claim 28, wherein the silicon-germanium alloy comprises an epitaxially-grown silicon-germanium alloy.

32. The memory device of claim 28, wherein the silicon-germanium alloy comprises approximately 20 at % germanium or more.

33. The memory device of claim 32, wherein the silicon-germanium alloy further comprises no more than approximately 50 at % germanium.

34. A memory device, comprising:
a plurality of word lines;
a plurality of bit lines;
a plurality of memory cells, wherein each memory cell comprises:
a capacitor; and
an access transistor having a gate coupled to a word line, a first source/drain region coupled to a bit line and a second source/drain region coupled to the capacitor;
wherein the access transistor further comprises:
a channel region in a bulk semiconductor substrate with the first source/drain region on a first side of the channel region and the second source/drain region on a second side of the channel region;
first and second extensions of epitaxial silicon-germanium alloy formed on the bulk semiconductor substrate, the first and second extensions of epitaxial silicon-germanium alloy respectively extending away from the first and second sides of the channel region;
a field isolation region laterally adjoining the first source/drain region and extending beneath at least a portion of the first source/drain region and extending beneath only a portion of the first extension of epitaxial silicon-germanium alloy; and
a field isolation region laterally adjoining the second source/drain region and extending beneath at least a portion of the second source/drain region and extending beneath only a portion of the second extension of epitaxial silicon-germanium alloy;
wherein the first and second source/drain regions each comprise polysilicon interposed between the extension of epitaxial silicon and the corresponding field isolation region.

35. A memory device, comprising:
a plurality of word lines;
a plurality of bit lines;
a plurality of memory cells, wherein each memory cell comprises:
  a capacitor; and
  an access transistor having a gate coupled to a word line, a first source/drain region coupled to a bit line and a second source/drain region coupled to the capacitor;
  wherein the access transistor further comprises:
    a channel region in a monocrystalline silicon substrate with the first source/drain region on a first side of the channel region and the second source/drain region on a second side of the channel region; and
    epitaxial silicon-germanium alloy formed on the monocrystalline silicon substrate so as to extend away from each side of the channel region;
    wherein the monocrystalline silicon substrate comprises monocrystalline silicon having a first conductivity type, the source/drain regions comprise polysilicon having a second conductivity type opposite the first conductivity type, and the epitaxial silicon-germanium alloy has a conductivity type.

36. A memory device, comprising:
a plurality of word lines;
a plurality of bit lines;
a plurality of memory cells, wherein each memory cell comprises:
  a capacitor; and
  an access transistor having a gate coupled to a word line, a first polycrystalline silicon source/drain region coupled to a bit line and a second polycrystalline source/drain region coupled to the capacitor;
  wherein the access transistor further comprises:
    a channel region in a monocrystalline silicon substrate with the first polycrystalline silicon source/drain region on a first side of the channel region and the second polycrystalline silicon source/drain region on a second side of the channel region; and
    epitaxial silicon-germanium alloy formed on the monocrystalline silicon substrate so as to extend away from each side of the channel region.

37. An electronic system comprising:
a processor;
a memory device coupled to the processor, the memory device comprising:
  a plurality of word lines;
  a plurality of bit lines;
  a plurality of memory cells, wherein each memory cell comprises:
    a capacitor; and
    an access transistor having a gate coupled to a word line, a first source/drain region coupled to a bit line and a second source/drain region coupled to the capacitor;
    wherein the access transistor further comprises:
      a channel region in a bulk semiconductor substrate with the first source/drain region on a first side of the channel region and the second source/drain region on a second side of the channel region;
      an extension of epitaxial silicon formed on the bulk semiconductor substrate so as to extend away from each side of the channel region;
      a field isolation region laterally adjoining the first source/drain region and extending beneath only a portion of the first source/drain region; and
      a field isolation region laterally adjoining the second source/drain region and extending beneath only a portion of the second source/drain region a field isolation region laterally adjoining the second source/drain region and extending beneath only a portion of the second source/drain region;
      wherein the first and second source/drain regions each comprise polysilicon interposed between the extension of epitaxial silicon and the corresponding field isolation region.

38. An electronic system comprising:
a processor;
a memory device coupled to the processor, the memory device comprising:
  a plurality of word lines;
  a plurality of bit lines;
  a plurality of memory cells, wherein each memory cell comprises:
    a capacitor; and
    an access transistor having a gate coupled to a word line, a first source/drain region coupled to a bit line and a second source/drain region coupled to the capacitor;
    wherein the access transistor further comprises:
      a channel region in a bulk semiconductor substrate with the first source/drain region on a first side of the channel region and the second source/drain region on a second side of the channel region;
      an extension of epitaxial silicon formed on the bulk semiconductor substrate so as to extend away from each side of the channel region;
      a field isolation region laterally adjoining the first source/drain region and extending beneath at least a portion of the first source/drain region; and
      a field isolation region laterally adjoining the second source/drain region and extending beneath at least a portion of the second source/drain region;
      wherein the bulk semiconductor substrate comprises monocrystalline silicon having a first conductivity type, the source/drain regions comprise polysilicon having a second conductivity type opposite the first conductivity type, and the extensions of epitaxial silicon comprise epitaxial silicon having a conductivity type.

39. The electronic system of claim 38, wherein the conductivity type of the epitaxial silicon is the second conductivity type.

40. The electronic system of claim 39, wherein the epitaxial silicon is further doped with germanium.

41. An electronic system comprising:
a processor;
a memory device coupled to the processor, the memory device comprising:
  a plurality of word lines;
  a plurality of bit lines;

a plurality of memory cells, wherein each memory cell comprises:
  a capacitor; and
  an access transistor having a gate coupled to a word line, a first source/drain region coupled to a bit line and a second source/drain region coupled to the capacitor;
  wherein the access transistor further comprises:
    a channel region in a bulk semiconductor substrate with the first source/drain region on a first side of the channel region and the second source/drain region on a second side of the channel region;
    an extension of epitaxial silicon-germanium alloy formed on the bulk semiconductor substrate so as to extend away from each side of the channel region;
    a field isolation region laterally adjoining the first source/drain region and extending beneath only a portion of the first source/drain region; and
    a field isolation region laterally adjoining the second source/drain region and extending beneath only a portion of the second source/drain region;
    wherein the first and second source/drain regions each comprise polysilicon interposed between the extension of epitaxial silicon and the corresponding field isolation region.

42. The electronic system of claim 41, wherein the bulk semiconductor substrate comprises monocrystalline silicon having a first conductivity type, the source/drain regions comprise polysilicon having a second conductivity type opposite the first conductivity type, and the extensions of silicon-germanium alloy comprise silicon-germanium alloy having a conductivity type.

43. The electronic system of claim 42, wherein the conductivity type of the silicon-germanium alloy is the second conductivity type.

44. The electronic system of claim 41, wherein the silicon-germanium alloy comprises an epitaxially-grown silicon-germanium alloy.

45. The electronic system of claim 41, wherein the silicon-germanium alloy comprises approximately 20 at % germanium or more.

46. The electronic system of claim 45, wherein the silicon-germanium alloy further comprises no more than approximately 50 at % germanium.

47. A field-effect transistor, comprising:
  a channel region in a bulk semiconductor substrate;
  a first source/drain region on a first side of the channel region and having a polysilicon portion;
  a second source/drain region on a second side of the channel region and having a polysilicon portion; and
  an extension of epitaxial monocrystalline material formed on the bulk semiconductor substrate so as to extend away from each side of the channel region, wherein a first extension of epitaxial monocrystalline material is interposed between the first side of the channel region and the polysilicon portion of the first source/drain region and a second extension of epitaxial monocrystalline material is interposed between the second side of the channel region and the polysilicon portion of the second source/drain region.

48. The field-effect transistor of claim 47, wherein the extensions of epitaxial monocrystalline material are of epitaxial silicon.

49. The field-effect transistor of claim 48, wherein the extensions of epitaxial silicon are of doped epitaxial silicon.

50. The field-effect transistor of claim 49, wherein the doped epitaxial silicon is doped with germanium.

51. The field-effect transistor of claim 47, wherein the extensions of monocrystalline material are an epitaxially grown silicon-germanium alloy.

52. The field-effect transistor of claim 51, wherein the silicon-germanium alloy comprises approximately 20 at % germanium or more.

53. The field-effect transistor of claim 52, wherein the silicon-germanium alloy further comprises no more than approximately 50 at % germanium.

54. A field-effect transistor, comprising:
  a channel region in a bulk semiconductor substrate;
  a first source/drain region on a first side of the channel region;
  a second source/drain region on a second side of the channel region; and
  an extension of epitaxial monocrystalline material formed on the bulk semiconductor substrate so as to extend away from each side of the channel region;
  wherein the bulk semiconductor substrate comprises monocrystalline silicon having a first conductivity type, the source/drain regions comprise polysilicon having a second conductivity type opposite the first conductivity type, and the extensions of epitaxial monocrystalline material comprise epitaxial silicon having a conductivity type.

55. The field-effect transistor of claim 54, wherein the conductivity type of the epitaxial silicon is the second conductivity type.

56. A memory device, comprising:
  a plurality of word lines;
  a plurality of bit lines;
  a plurality of memory cells, wherein each memory cell comprises:
    a capacitor; and
    an access transistor having a gate coupled to a word line, a first source/drain region coupled to a bit line and a second source/drain region coupled to the capacitor, the first and second source/drain regions each comprising a polysilicon portion;
  wherein the access transistor further comprises:
    a channel region in a bulk semiconductor substrate with the first source/drain region on a first side of the channel region and the second source/drain region on a second side of the channel region; and
    an epitaxial monocrystalline material formed on the bulk semiconductor substrate and interposed between the channel region and the polysilicon portions of the first and second source/drain regions.

57. An electronic system comprising:
  a processor;
  a memory device coupled to the processor, the memory device comprising:
    a plurality of word lines;
    a plurality of bit lines;
    a plurality of memory cells, wherein each memory cell comprises:
      a capacitor; and
      an access transistor having a gate coupled to a word line, a first source/drain region coupled to a bit line and a second source/drain region coupled to the capacitor, the first and second source/drain regions each comprising a polysilicon portion;

wherein the access transistor further comprises:
a channel region in a bulk semiconductor substrate with the first source/drain region on a first side of the channel region and the second source/drain region on a second side of the channel region; and
an epitaxial monocrystalline material formed on the bulk semiconductor substrate and interposed between the channel region and the polysilicon portions of the first and second source/drain regions.

* * * * *

UNITED STATES PATENT AND TRADEMARK OFFICE
CERTIFICATE OF CORRECTION

PATENT NO. : 7,119,369 B2  Page 1 of 1
APPLICATION NO. : 10/758059
DATED : October 10, 2006
INVENTOR(S) : Zhongze Wang, Chih-Chen Cho and Er-Xuan Ping It is certified that error appears in the above-identified patent and that said Letters Patent is hereby corrected as shown below:

Title Page #73
In the Assignee, "Micro Technology, Inc." should read --Micron Technology, Inc.--.
Column 9, line 52, replace "at least" with --only--.
Column 9, line 56, replace "at least" with --only--.
Column 10, line 54, replace "at least" with --only--.
Column 10, line 58, before "a portion of" insert --only--.
Column 10, line 59, replace "at least" with --only--.
Column 11, line 57, replace "at least" with --only--.
Column 11, line 60, replace "at least" with --only--.

Signed and Sealed this

Twenty-seventh Day of November, 2007

JON W. DUDAS
*Director of the United States Patent and Trademark Office*